(12) United States Patent
Wallach

(10) Patent No.: US 7,580,429 B1
(45) Date of Patent: Aug. 25, 2009

(54) SYSTEM AND METHODS FOR IMPROVING DATA COMPRESSION

(75) Inventor: Clifford H. Wallach, Buffalo Grove, IL (US)

(73) Assignee: U.S. Robotics, Schaumburg, IL (US)

( * ) Notice: Subject to any disclaimer, the term of this patent is extended or adjusted under 35 U.S.C. 154(b) by 1759 days.

(21) Appl. No.: 10/235,574

(22) Filed: Sep. 5, 2002

(51) Int. Cl.
*H03M 7/30* (2006.01)

(52) U.S. Cl. .................. 370/521; 370/477; 341/51; 704/10

(58) Field of Classification Search .................. 370/521, 370/477; 341/51; 704/10
See application file for complete search history.

(56) References Cited

U.S. PATENT DOCUMENTS

| | | | |
|---|---|---|---|
| 4,068,298 A * | 1/1978 | Dechant et al. ................. 707/3 |
| 4,814,746 A * | 3/1989 | Miller et al. .................. 341/95 |
| 4,821,290 A * | 4/1989 | Hingorani et al. ........... 375/242 |
| 4,876,541 A * | 10/1989 | Storer .......................... 341/51 |
| 5,151,697 A * | 9/1992 | Bunton ........................ 341/51 |
| 5,153,591 A * | 10/1992 | Clark .......................... 341/51 |
| 5,450,562 A * | 9/1995 | Rosenberg et al. .......... 711/119 |
| 5,627,533 A * | 5/1997 | Clark .......................... 341/51 |
| 6,236,341 B1 * | 5/2001 | Dorward et al. ............... 341/60 |

\* cited by examiner

*Primary Examiner*—Min Jung
(74) *Attorney, Agent, or Firm*—Mayer Brown LLP

(57) ABSTRACT

An improved data compression system and method is disclosed. The data compression method uses smaller fixed bit words to represent streams of digital data. The fixed bit words are sent instead of the streams of digital data. A table relating the fixed bit words and streams of digital data is provided as a dictionary. Each entry has a node which is indexed in a stored index. As additional fixed bit words are established for new streams of digital data, older fixed bit words are deleted from the dictionary. The older fixed bit words are prevented from being deleted if they are used for subsequent streams of data. There are a number of methods to determine how the older fixed bit words are retained which are disclosed.

15 Claims, 2 Drawing Sheets

SYSTEM AND METHODS FOR IMPROVING DATA COMPRESSION

FIELD OF INVENTION

The present invention relates generally to the field of telecommunications systems and methods. More specifically, the present invention is directed to improved systems and methods for enhanced data compression through a communication channel.

BACKGROUND OF INVENTION

There are a wide variety of data compression techniques currently utilized in the field of telecommunications. Each of these different approaches has its own unique characteristics and advantages.

In accordance with one such approach known as the MNP5 coding algorithm, an encoder takes a stream of data bits and converts this data to a code for transmission. Essentially two distinct compression algorithms are utilized by MNP5 coding. The first of these is simple run length encoding. In run length encoding the system basically identifies fixed length runs of identical characters and then replaces the string of identical characters with exactly three of those characters and a count of the additional like characters that have been removed. For example, "n" adjacent blank spaces in a file would be transmitted to the receiving side as 3 blank spaces and the result of the equation "n_3".

Subsequent to the initial run length compression, first order Huffman encoding is applied. Huffman encoding monitors the frequency of occurrence of each character in the data stream and updates an ASCII table accordingly. Each character position in the table is assigned a unique bit pattern from 4 bits to 12 bits to represent it. To begin with the tables in the transmitting modem and the receiving modem are identical. As a character is used more frequently, it moves up in the table, thus reducing the number of bits required for its representation. The transmitting side encodes the character based on the current table and then updates the count for that character. If the updated count causes a shuffling of the table it is performed after the character is transmitted. On the receiving end, the character is decoded prior to updating the count of that specific character in the table. Once the count is incremented the table will be re-sorted accordingly and thus will remain in synch with the transmitting side. This eliminates the need to separately transmit data regarding changes in the table. Compression is thus achieved through utilizing fewer numbers of data bits to transmit the more frequently occurring characters.

Another type of data compression performed by conventional modems pursuant to the V.42 BIS modem communication standard is the Lempel_Ziv compression technique that was originally developed in the late 1970's through a variety of technical publications. In Lempel_Ziv compression, variable length strings of data are converted into fixed sized code words and stored in a dictionary. Initially the dictionary is populated with 256 code words, one for each of the characters in the ASCII character set. Each codeword is transmitted using a fixed number of bits depending on the dictionary size. 11 bits are needed for a dictionary size of 2048 entires.

Thereafter, as a stream of data characters are transmitted by the system, additional table values are determined. These additional table values are determined based on the specific sequence of the characters within the data stream that is to be transmitted. For example, in accordance with the V.42 BIS standard, transmission of portions of the data stream "Hello Henry" would take place as follows.

The first occurrence of the "H" would simply be transmitted as the 11 bit codeword set forth in the original dictionary that corresponds to the ASCII representation of that capital "H". Transmission of this single character would not alter the dictionary. The next character, "e" is then transmitted as the 11 bit codeword that corresponds with the ASCII representation of "e" in the dictionary and the string "He" is added to the dictionary. The next step is to transmit "l". The string "el" is then added to the dictionary. The letter "l" is then transmitted again and "ll" is added to the dictionary. Transmission continues in this manner until the string "He" is encountered as part of the word "Henry."

At this point, the 11 bit codeword for the string "He" is then transmitted, thus eliminating the need for transmitting a character. Because the table at the decoder side is built in parallel with the encode table, and based on the same protocol, the 11 bit codeword is readily translated into the proper string. The table continues to build in this manner with the new dictionary entries being created always from the longest string that can be matched plus the next character that was transmitted. A string is not added if a string longer than the maximum negotiated string length would be created. Once the dictionary is full, old strings are then deleted when new strings are added.

This technique essentially is comprised of two primary data structures. One of the data structures is a dictionary that records strings and the second is a history buffer that records the last number of characters passed through the data compressor. Dictionary entries reference an index in the history buffer. Due to the fact that the characters are continually being added to the buffer and the buffer is of a finite size, eventually an index will age and become invalid. Furthermore, strings are constantly being added to the dictionary. Eventually either the history buffer or the dictionary will become full. Both situations must be handled by the system. One conventional approach to solving this problem is to simply clear all of the data structures including the history buffer as well as the dictionary. However, this approach degrades the overall compression ratio.

In this approach, as the dictionary fills up and then empties in a repetitive saw-tooth cycle, over time the dictionary averages being approximately half-full or about 50 percent utilization. In order to encode a dictionary entry with this approach the system requires log base 2 (dictionary size) number of bits. When only half the dictionary is in use, then it is possible that an equivalent dictionary with half the size and 100 percent utilization could be used and would require one less bit. The use of one less bit would improve compression performance by reducing the overall size of the compressed output.

For example, consider that a 1024 entry dictionary requires 10 bits in order to encode an entry, while a 512 entry dictionary requires only nine bits to encode an entry. When only 512 elements are used, from a 1024 size dictionary, then in theory a 512 size dictionary could have been utilized instead of the 1024 size dictionary. Had the smaller dictionary been utilized, then the compression performance would have improved by saving extra bit, 9 vs 10.

In order to maintain a full dictionary, it is necessary to adopt one of either two alternative strategies. The first of these approaches is to stop adding new strings when the dictionary is full. This provides the advantage of simplicity but stops further adaptation to the data stream, resulting in diminished performance over time.

Another solution is to make space in the dictionary for new strings by removing old strings. Preferably the strings removed will be the least recently used strings. This approach, however, is greatly complicated due to the fact that dictionary entries record the index into the history buffer. This buffer is of a finite size and therefore the index will age and become invalid as characters are continually being added to this buffer. Optimal performance can be obtained only by eliminating entries when their indices become invalid or when needed in order to create room for a new string.

For example, the existing V.44 algorithm involves attempting to find a string of previously processed characters that matches the next characters to be processed. If such a string exists, the codeword representing the string is transmitted. Characters which are input are placed in the next available locations in the history file by the following criteria. Using the input character and the next character, the encoder attempts to find the longest matching string in the dictionary and transfers the code word on a match. If a string match is not found, the encoder transfers the ordinal corresponding to the input character and attempts the above again. The encoder attempts to extend the longest string match up to the maximum string length. If the longest string match is extended by one or more characters, the encoder transfers a string extension length indicating the number of characters by which the string has been extended. After finding the longest string, the encoder then returns to try to match the next character. Several modifications to the existing V.44 algorithm simplify this task, but even with these modifications, optimal performance using all the contents of the dictionary effectively remains an issue.

Thus there is a need for a method and system of data compression which provides optimal performance of a compression dictionary by eliminating unused entries to create room for new entries. There is also a need for a compression technique which allows elimination of dictionary entries which are not used. Finally there is a need for a compression technique which will make data compression more efficient by keeping often used dictionary entries.

SUMMARY OF THE INVENTION

These needs and others may be met by the present invention which has an aspect which is a method of compressing digital data for transmission over a communications channel. Strings of digital data are first determined. A fixed size code word is then assigned to a string of digital data. The fixed size code word and corresponding string of digital data is stored in a dictionary as a node. Subsequent fixed size code words are stored as new nodes in the dictionary representing subsequent different strings of digital data ahead of the node storing the first fixed sized code word. Previous stored nodes are deleted from the dictionary as new nodes are stored. A subsequent part of digital data is examined for the string of digital data. The deletion of the fixed size code word is delayed when a match is made between the string of digital data and the subsequent part of the digital data.

The invention may also be embodied in a data compressor which compresses a digital stream of data. The compressor includes an encoder which matches strings of digital data with fixed size code words. A transmitter is coupled to the encoder which sends the fixed size code word. A memory is coupled to the encoder to store a dictionary with nodes representing strings of digital data and the fixed size code word and an index relating to the frequency that the fixed size code words are sent. The fixed size code words are deleted from the dictionary as additional fixed sized code words are added. A processor delays the deletion of fixed sized code words when a specific fixed sized code word is sent.

It is to be understood that both the foregoing general description and the following detailed description are not limiting but are intended to provide further explanation of the invention claimed. The accompanying drawings, which are incorporated in and constitute part of this specification, are included to illustrate and provide a further understanding of the method and system of the invention. Together with the description, the drawings serve to explain the principles of the invention.

BRIEF DESCRIPTION OF DRAWINGS

These and further aspects and advantages of the invention will be discussed more in detail hereinafter with reference to the disclosure of preferred embodiments, and in particular with reference to the appended Figures wherein.

DESCRIPTION OF THE PREFERRED EMBODIMENT

Figure 1:
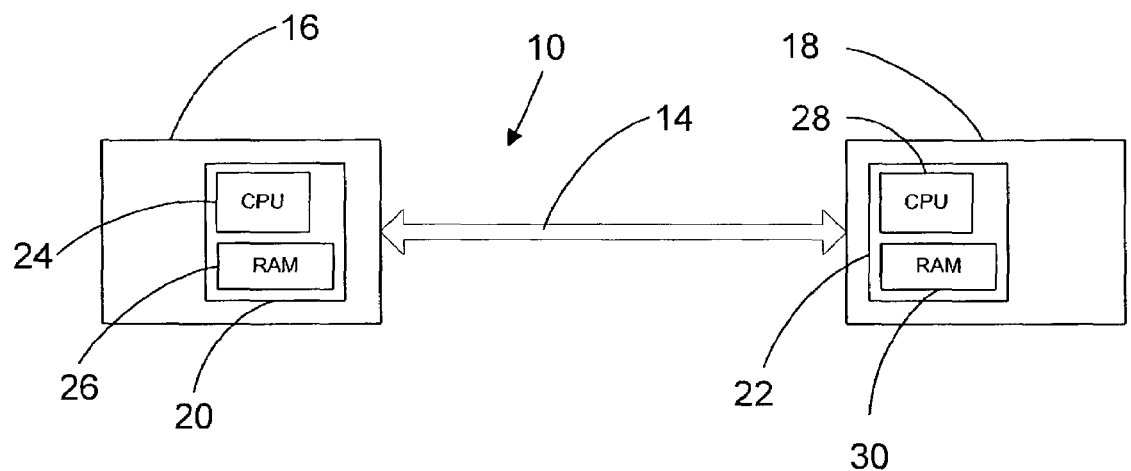
FIG. 1 is a block diagram of a data transmission system utilizing the data compression of the present invention.

While the present invention is capable of embodiment in various forms, there is shown in the drawings and will hereinafter be described a presently preferred embodiment with the understanding that the present disclosure is to be considered as an exemplification of the invention, and is not intended to limit the invention to the specific embodiment illustrated.

FIG. 1 illustrates a first preferred exemplary embodiment of the present invention that is shown generally at 10. In accordance with the preferred exemplary embodiment of the present invention, a communication system 12 has a communications channel 14 which is used to connect a transmit side 16 and a receive side 18. It is to be understood that the transmit side 16 and the receive side 18 are data transmitters and receivers such as a computer attached to a modem. The communications channel 14 thus may be any suitable medium such as phone line, Ethernet cable, fiber optic cable or wireless channel.

The transmit side 16 includes a data encoder 20 and the receive side 18 includes a data decoder 22. The data encoder 20 has a CPU 24 and a memory such as RAM 26 in order to store compression information such as a dictionary and history index as will be explained below. The CPU 24 processes compression algorithms which will be explained below. Similarly, the data decoder 22 has a CPU 28 and a memory such as RAM 30 in order to store the identical compression information and algorithms as the data encoder 20.

The system 12 utilizes a form of Lempel_Ziv compression, wherein variable length strings of data are converted into fixed sized code words and stored in a node which relates the fixed sized code word with the variable length string of data. The node becomes a part of a dictionary stored in the RAM 26 of the data encoder 20. Initially, in a preferred exemplary embodiment, the dictionary is populated with 256 code words, one for each of the characters in the ASCII character set. Each code word is transmitted using a fixed number of bits depending on the dictionary size. As is known, 11 bits are needed for a dictionary size of 2048 elements. Those skilled in the art will appreciate that other sizes for the code words and dictionary are contemplated and considered within the scope of the invention. These values have been set forth for providing an exemplary embodiment.

As a stream of data characters are transmitted by the system 12 through the encoder 20, additional table values are determined. These additional table values are determined based on the specific sequence of the characters within the data stream that is to be transmitted. The system 10 is configured so that the encoder 20 and the decoder 22 develop identical tables of the sequence of characters or strings using the same characters. The decoder 22 lags behind the encoder 20 by one update in the tables. Further data is thus compressed by using the representative bits from the tables for transmission. Those skilled in the art will appreciate that both sides of the communication system 12 include transmission and receive capabilities for bi-directional communication through the channel 14. In order to understand the invention, it is only necessary to consider one transmission path.

Additionally, the encoder 20 and decoder 22 store a history index buffer in their respective RAM 26 and 30 which records the last sequence of characters passed through and compressed. The dictionary nodes also reference an index in the history index buffer which reflects the occurrence of the entry in the compression process. In order to prevent the dictionary and index from overfilling the memory, the encoder 20 and decoder 22 periodically purge the dictionary and history index buffers of entries which have not been used. As will be explained below, the process of purging the dictionary and the history index buffer may be performed in a manner which will make data compression more efficient.

Whenever a string is matched from the stored table and its corresponding codeword is encoded and transmitted by the encoder 20, that node's history index is updated to the latest value in the history buffer. The dictionary node entry still represents the identical string, except with a newer history index. The newer index delays the string from being eliminated from the dictionary. Frequently matched strings will therefore not be purged from the dictionary and remain available for use in the encoder 20.

The preceding is simplified by a shift from multi-level dictionary trees to single level trees. For example, in a preferred exemplary embodiment, each node is linked to one of the 256 root nodes in a flat structure. It is also possible to keep multi-level dictionary trees, except that each intermediate node would also need to have its history index updated. At least three specific algorithms may be utilized with a mixture of trade-offs relating to use of RAM and CPU clock cycles in the encoder 20 and decoder 22.

Figure 2:
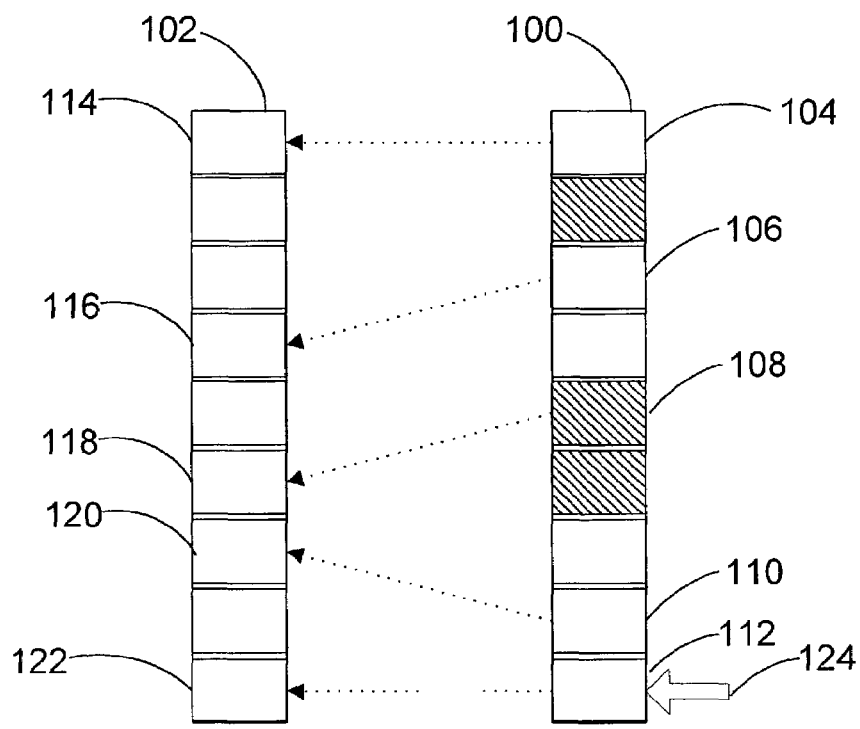
FIG. 2 is a block diagram of the components used by the data compression method according to one aspect of the present invention.

FIG. 2 shows a dictionary 100 and history index 102 in accordance with a first exemplary embodiment which may be used by the encoder 20 and decoder 22 in FIG. 1. The dictionary 100 has a series of nodes 104, 106, 108, 110 and 112 which represent a string and its code. Some of the nodes in the dictionary 100 are empty. It is to be understood that there are 256 initial nodes and additional nodes which are added during the compression process. These nodes are represented by nodes 104-112. Each node 104-112 has a corresponding entry 114-122 in the history index 102 indicating when the node was created and accessed by the encoder 20. The most recently created string and code is represented by node 104 while the node 112 is the oldest node. Whenever a string is matched and transmitted by the encoder 20, an updated copy of its corresponding dictionary entry is created (with the latest history index) and the original entry is then deleted from the history index 102. The updated entry is left unused. A cyclic index 124 is used to purge nodes starting from the last node 112 whenever a new entry is created. The cyclic index 124 is a simple counter which cycles from 0 to the dictionary size— 1. It is used to select the next dictionary node for deletion which is a good approximation to the least recently used dictionary node.

For example, if a character string is matched to the entry in node 108, the encoder will take the code word from the node 108 for transmission. The node 104 is then created using the latest history index which results in a functionally equivalent string as that of node 108. The data in the node 108 will then be deleted. The cyclic index 124 then cycles through the nodes 106-112, deletes the node 112 and assigns a new string and code to the vacated node 108 when the encoder 20 finds such an unmatched string.

This procedure is fast and requires the least amount of RAM because no additional record keeping is required. However, a tradeoff is made in compression ratio due to the fact that all of the nodes in the dictionary 100 are not in use due to the fact that empty nodes may be created.

Figure 3:
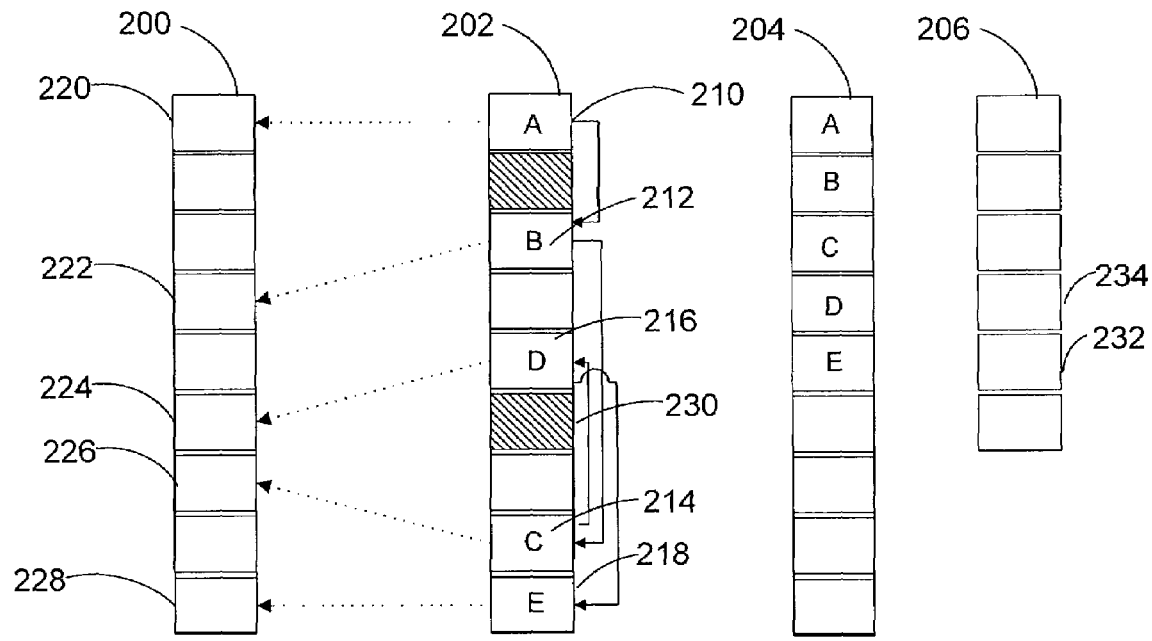
FIG. 3 is a block diagram of the components used by the data compression method according to a second aspect of the present invention.

A second alternate exemplary embodiment, shown in FIG. 3, has a history index buffer 200, a dictionary 202, a doubly linked allocation node list 204 and a doubly linked empty node list 206 stored in the RAM 26 and the RAM 30 which are used by the encoder 20 and the decoder 22. The dictionary 202 has a series of nodes 210, 212, 214, 216 and 218 which each have a string and corresponding code word. The nodes 210-218 also contain the location in the dictionary 202 of the previous node in sequence and the location of the subsequent node in their allocation order. The history buffer 200 has a group of index entries 220-228 corresponding to the nodes 210-218 which indicates when they were created. The doubly linked node list 204 keeps track of the nodes 210-218 in their allocation (historical) order. Whenever a string is matched and sent, its entry in the history index 202 is updated in the encoder 20 and the node is to moved to head of the doubly linked allocation node list 204 stored in the RAM 26 of the encoder 20. Similarly, the same operation is performed to store changes in the RAM 30 of the decoder 22.

For example, if the encoder 20 matches a string with an existing node such as the node 216 in the dictionary 202, the entry in the history index 200 is updated with the information. The corresponding entry in the allocation list 204 is moved to the head of the allocation list 204. The last node in the allocation list 204 is the least recently used node which is deleted from the dictionary 202 when a new string is added. For example, if node 218 is the last node in the doubly linked allocation list 204, it will be deleted when a new node is created. The node 218 will then be assigned pointers to a previously deleted node such as node 230 to become the a last entry 232 in the empty node allocation list 206. An entry 234 of the previously deleted node 230 is moved up the empty node allocation list 206. New entries to the dictionary 202 will be assigned the first node from the empty node allocation list 206.

This procedure is somewhat slower and requires two additional words per dictionary entry than the approach discussed above. The compression ratio is maximized, however, because all nodes are in use.

Figure 4:
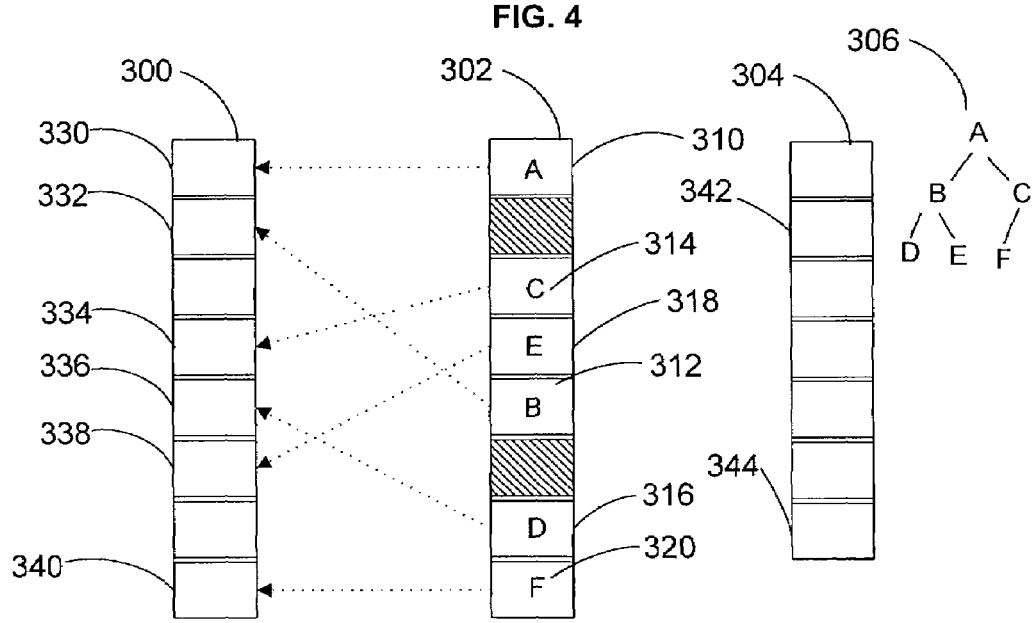
FIG. 4 is a block diagram of the components used by the data compression method according to a third aspect of the present invention.

Another alternative exemplary embodiment is shown in FIG. 4. This embodiment has a history buffer 300, a dictionary 302, a priority queue or a heap structure 304 and a tree structure 306 to provide an efficient method for detecting the oldest index from a large set. The tree structure 306 is able to partially order the dictionary entries from oldest to newest. The priority queue or heap structure 304 is used to order deleted available nodes from oldest deleted to most recently deleted. This procedure is slower than the two preceding algorithms as it requires an extra word per dictionary entry, but the compression ratio is maximized because all of the nodes are in use.

In accordance with this exemplary embodiment, the dictionary 302 has a number of nodes 310-320 which each include a string and a corresponding code word which have corresponding historical values 330-340 in the index 300. The binary tree structure 306 organizes the nodes 310-320 by their corresponding values 330-340 in the index 300. One basic rule for this approach is that each node in the tree structure 306 has (0-2) child nodes each with a more recent index value. In this way, only the oldest node's index needs to be checked for drifting off the history index 300 because all of its child nodes are equal or newer than the root node. Because of the string extension procedure, two or more nodes may share the same starting index. Accordingly, whenever the oldest node such as the node 320 is removed from the dictionary 302 and the tree 306 is reordered, the next oldest node must also be checked. Adding an entry is trivial because new entries are the newest nodes. They are simply appended to the tree 306.

A code words index entry in the history index 300 gets updated whenever it is matched. The tree structure 306 does not have to be rebalanced because the new index is always newer than the old index. There will be a temporary violation of the partial ordering; however, this is corrected whenever the node is examined. Whenever a node arrives at the root, its current index must be saved for the comparison with the history buffer size. The heap structure has a series of entries after an entry 342 which represents the oldest deleted node to entry 344 which represents the most recent deleted node. Unused or deleted nodes such as node 320 are added to the end entry 344 of the heap structure 304 for use as additional, new nodes in the tree structure 306 by the encoder 20.

It will be apparent to those skilled in the art that various modifications and variations can be made in the method and system of the present invention without departing from the spirit or scope of the invention. Thus, the present invention is not limited by the foregoing descriptions but is intended to cover all modifications and variations that come within the scope of the spirit of the invention and the claims that follow.

What is claimed is:

1. A method of compressing digital data for transmission over a communications channel, the method comprising:
   determining strings of digital data;
   assigning a fixed size code word to a string of digital data;
   storing the fixed size code word and corresponding string of digital data in a dictionary as a node;
   storing subsequent fixed size code words as new nodes in the dictionary representing subsequent different strings of digital data ahead of the node storing the first fixed sized code word;
   examining a subsequent part of digital data for the string of digital data; and
   deleting the fixed size code word's node from the dictionary and adding the fixed size code word's node to the dictionary when a match is made between the string of digital data and the subsequent part of the digital data.

2. The method of claim 1 further comprising:
   sending the fixed size code word in place of the string of digital data to a receiver; and
   translating the fixed sized code word into the string of digital data;
   wherein the receiver maintains a duplicate dictionary.

3. The method of claim 1 wherein the fixed sized code word node in the dictionary is deleted using a cyclic index.

4. The method of claim 1 further comprising storing a history index which records when the nodes are used to represent subsequent strings of data.

5. The method of claim 4 wherein the deletion and addition of the original fixed sized code word node includes:
   establishing a priority queue to record nodes in the order they are used to represent subsequent strings of data;
   updating the history index of the original fixed sized code word node and moving the record of the node to the start of priority queue.

6. The method of claim 5 wherein the deletion and addition of the fixed sized code word node includes:
   establishing a second priority queue to record empty nodes in the order that they are deleted; and
   moving the record of the deleted node to the end of the second priority queue.

7. The method of claim 1 wherein the deletion and addition of the original fixed sized code word node includes:
   ordering the nodes in the dictionary in a binary tree by the time they are used to represent subsequent strings of data; and
   moving the node representing the original fixed sized code word to the top of the order in the binary tree when the code word is used to represent a subsequent string of data.

8. The method of claim 7 wherein the deletion and addition of the original fixed sized code word node includes:
   establishing a heap structure ordering records representing the deleted nodes in the dictionary; and
   adding a record of a node which is deleted to the end of the heap structure.

9. The method of claim 1 wherein the communications channel is a wireless link.

10. The method of claim 1 wherein the communications channel is a fiber optic cable.

11. The method of claim 1 wherein the communications channel is a phone line.

12. A data compressor which compresses a digital stream of data, the compressor comprising:
   an encoder which matches strings of digital data with fixed size code words;
   a transmitter coupled to the encoder which sends the fixed size code word;
   a memory coupled to the encoder to store a dictionary with nodes representing strings of digital data, the fixed size code word and an index relating to the frequency that the fixed size code words are sent, wherein the fixed size code words are deleted from the dictionary as additional fixed sized code words are added; and a processor which, when a string is matched, creates a copy of the node representing the string, creates a new node to store the copy of the node, and deletes the node representing the string from the dictionary.

13. The data compressor of claim 12 wherein the memory includes a linked list with entries to record nodes in the order they are used to represent subsequent strings of data; and wherein the entry relating to a node is updated by moving the entry to the start of the linked list when the node is used.

14. The data compressor of claim 13 wherein the memory includes a second linked list with entries to record nodes which have been deleted; and wherein a new entry is created at the end of the second linked list for each node deleted.

15. The data compressor of claim 12 wherein the nodes are maintained by a binary tree structure.

* * * * *